(12) United States Patent
Droz

(10) Patent No.: US 6,206,291 B1
(45) Date of Patent: *Mar. 27, 2001

(54) FLAT CARD HAVING INTERNAL RELIEF AND INCORPORATING AT LEAST ONE ELECTRONIC ELEMENT

(75) Inventor: Francois Droz, La Chaux-de-Fonds (CH)

(73) Assignee: NagraID S.A., La Chaux-de-Fonds (CH)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/836,475
(22) PCT Filed: Oct. 30, 1995
(86) PCT No.: PCT/EP95/04249
§ 371 Date: Jul. 8, 1997
§ 102(e) Date: Jul. 8, 1997
(87) PCT Pub. No.: WO96/17320
PCT Pub. Date: Jun. 6, 1996

(30) Foreign Application Priority Data

Nov. 25, 1994 (FR) .................................................... 94 14169

(51) Int. Cl.[7] ...................................................... G06K 19/02
(52) U.S. Cl. ............................................. 235/488; 235/492
(58) Field of Search ...................................... 235/488, 487, 235/492; 902/26, 27

(56) References Cited

U.S. PATENT DOCUMENTS

| 4,020,278 | * | 4/1977 | Carre et al. | 358/128 |
|---|---|---|---|---|
| 4,758,689 | * | 7/1988 | Nakao et al. | 174/52 |
| 4,882,477 | * | 11/1989 | Oogita et al. | 235/448 |
| 4,960,983 | * | 10/1990 | Inoue | 235/449 |
| 4,994,659 | * | 2/1991 | Yabe et al. | 235/492 |
| 5,010,243 | * | 4/1991 | Fukushima et al. | 235/488 |
| 5,111,033 | * | 5/1992 | Fujita et al. | 235/488 |
| 5,399,847 | * | 3/1995 | Droz | 235/488 |
| 5,461,256 | * | 10/1995 | Yamada et al. | 257/679 |
| 5,585,618 | * | 12/1996 | Droz | 235/492 |

FOREIGN PATENT DOCUMENTS 0 570 784    11/1993    (EP) .

* cited by examiner

Primary Examiner—Thien M. Le
(74) Attorney, Agent, or Firm—Griffin & Szipl, P.C.

(57) ABSTRACT

A card (1) including a lower layer (2) and a layer (4) of solidified binder (6) in which various elements are incorporated, in particular a coil (12) electrically coupled to an electronic unit (8). The coil (12) exhibits a lower planar surface (30), the inner face (20) of the lower layer (2) exhibiting a relief (18) defining sunken valleys traversing said inner face (20).

19 Claims, 3 Drawing Sheets

FLAT CARD HAVING INTERNAL RELIEF AND INCORPORATING AT LEAST ONE ELECTRONIC ELEMENT

FIELD OF THE INVENTION

The present invention concerns electronic cards incorporating at least one electronic element.

In particular, a card according to the invention comprises an integrated circuit serving for example for the identification of persons.

BACKGROUND OF THE INVENTION

A category of electronic cards concerned by the invention is made up by cards without exterior electrical contact and possessing a coil enabling electromagnetic coupling with an external arrangement.

By card is understood every object having a substantially planar structure defining a general plane of the object and exhibiting any contour whatsoever in such general plane.

The patent document EP 0 570 784 in the name of the present applicant describes various embodiments of an electronic card comprising a layer formed by a solidified binder in which is incorporated at least one electronic element electrically coupled to a coil. This document also describes various embodiments of a method of manufacture of such a card.

In a particularly advantageous embodiment, there is provided a positioning structure exhibiting at least one principal opening in which is housed the electronic element. In each embodiment described, the coil and the electronic element are housed within such principal opening. In all the proposed embodiments, the various elements incorporated within the solidified layer of binder are located facing entirely planar surfaces.

According to an embodiment of the method of manufacture described in the patent document EP 0 570 784, the following various steps for the manufacture of a card are provided:

I) the bringing onto a work surface of a first outer layer formed from a solid material;

II) the placing of at least one electronic element on the first outer layer;

III) the bringing of a binder onto the first outer layer;

IV) the bringing onto said binder of a second outer layer formed from a solid material and facing the first outer layer;

V) the application of a pressure on the first and second outer layers until such outer layers are located at a predetermined distance relative to one another.

In a final step, the binder is solidified in order to form an intermediate layer between the outer layers.

According to a specific characteristic of the method described hereinbefore, a positioning structure, defining at least one internal zone serving in particular for positioning the coil, is brought in between steps I and IV of the method.

According to a variant of the method described hereinbefore, it is foreseen to bring initially the planar outer layer and the various elements to be incorporated into the card, in particular the electronic element electrically coupled to the coil and also a positioning structure when the latter is provided. Next, the binder is applied in the form of a viscous liquid. Onto such binder is then applied the second outer layer. Finally, with the help of pressing means, pressure is exerted on the outer layers and consequently on the binder along a direction perpendicular to the work surface so as to form the layer of binder in which are incorporated various elements as provided.

The variant of the method described hereinbefore is very advantageous from an economic viewpoint since it enables producing large quantities of cards at low cost. Additionally, such variant is advantageous from the fact that it does not necessitate applying heat in order to melt the outer layers, thus avoiding the shrinkage phenomena of the material and buckling of the card once cooled. However, the applicant has observed in the course of numerous experiments that the method described hereinbefore brings results which are satisfactory for various specific embodiments, but that on the other hand a certain number of cards obtained by this method and having one of the structures proposed in patent document EP 0 570 784 does not exhibit a sufficiently satisfactory flatness such that for certain embodiments the industrial yield is relatively low.

Effectively, the requirement of flatness for electronic cards is particularly high, in particular when printing is provided on an external surface of such cards. Certain printing techniques require absolutely planar outer surfaces, lacking which deformations appear in the printed message.

SUMMARY OF THE INVENTION

The purpose of the present invention is to overcome the drawbacks remaining in the invention described in patent document EP 0 570 784 in providing an electronic card exhibiting very good flatness and no residual air in the binder layer, such card also being obtainable with the help of a relatively simple method.

Here it should be mentioned that the applicant has carried out extensive research on the cards produced according to the method described hereinbefore in order to detect the nature of the problem causing deformations in the surface of a certain number of cards. During such research, the applicant has initially determined that in a certain number of applications the coil occupied a relatively large surface as projected into the general plane of the card. Next, and in contrast to the coils as shown drawn on the figures of patent document EP 0 570 784, the coils used in electronic cards generally exhibit a cross-section of rectangular form. Additionally, such coils are self-supporting, that is to say, the windings of such coils are glued to one another. Thus, the coil exhibits a definite form and a certain rigidity.

In the variant of the method described hereinbefore, when the coil is applied to the first planar outer layer, the lower surface of such coil then bears against the inner face of such first outer layer. When the binder is applied in the form of a viscous liquid and pressure is exerted on the latter, the binder spreads out and covers the upper surface of the coil, which generates a resultant pressure on such coil towards the work surface. The coil is thus pressed against the first outer layer and the binder does not infiltrate between the coil and such first outer layer. Thereby, the first outer layer does not adhere to the layer of binder on its superposition surface with the coil, which can bring about deformations on the surface of the first outer layer following solidification of the binder and removal of the pressure exerted on the latter.

The above-mentioned problem is further aggravated by a second problem connected with the state of the lower surface of the coil. Effectively, the coil is formed from windings exhibiting a circular cross-section. The coils are formed with the help of a winding arrangement generally exhibiting two flanges between which the coil is formed. Inevitably, the surfaces of the coil exhibit a multitude of furrows, certain of which may have a depth which is not negligible. Once the coil is brought onto the inner face of the outer layer, the furrows located on the lower surface of the coil define at least one substantially closed space between the coil and the outer layer, resulting in a confinement of air during formation of the card. Such residual air can be slightly pressurized during the application of pressure on the binder serving to form the binder layer which brings about deformations of the outer face of the outer layer when application of the pressure has ceased. Additionally, it has been observed that when said pressure is removed, the residual air confined between the coil and the outer layer is apt to diffuse within the card and in particular at the interface between the outer layer initially supplied and the layer of binder.

It will be mentioned that similar problems appear with other elements incorporated in an electronic card, in particular when a substrate is provided on which the electronic element is secured, such as that described on FIGS. 10 and 11 of patent document EP 0 570 784. Such problems can also be encountered with other elements incorporated in the card, for example with an electronic unit of a certain dimension exhibiting a planar face or a protection ring on the interior of which is housed an integrated circuit for example.

In order to achieve the purpose of the invention in resolving the above-mentioned problems, the invention has as object a card comprising an element having a first surface substantially planar or exhibiting at least one external cavity which can be substantially closed by a geometric plane, a first layer of solid material and a second layer formed by a solidified binder in which said element is immersed. The first layer exhibits a first inner face to which the solidified binder adheres. Such card is characterized in that the first inner face exhibits a relief provided at least in the interior of a first zone comprising the surface of superposition between said first surface of said element and said first inner face, such relief defining sunken valleys traversing said first zone.

The card according to the invention exhibits at least two important advantages. Firstly, the relief provided on the inner face of the first layer assures proper evacuation of all residual air during manufacture of the card with the help of a viscous liquid binder applied onto the various elements incorporated in said card. Secondly, such card permits the binder, applied in the form of a viscous liquid, to be correctly infiltrated between said first surface of said element incorporated in the second layer and the inner face of said first layer. According to a variant embodiment, the totality of the inner face of the first layer exhibits a relief defining sunken valleys traversing said inner face.

According to a variant embodiment, a third layer is provided arranged so that the second layer forms an intermediate layer between the first and third layers.

According to another embodiment, in addition to said element, there is provided a positioning structure for such element within the layer of binder.

Other characteristics and advantages of the present invention will be still better described with the help of the following description made with reference to the annexed drawings representing non-limiting examples.

DETAILED DESCRIPTION OF THE INVENTION

With the help of FIGS. 1 and 2, there will hereinafter be described a first embodiment of an electronic card according to the invention as well as an embodiment of a method of manufacture of such card.

Figure 1:
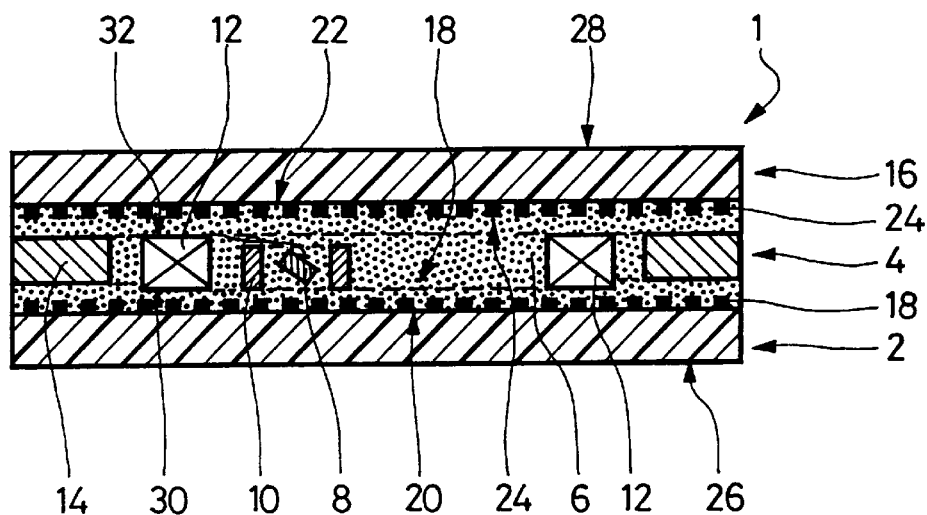
FIG. 1 is a cross-section view of a first embodiment of an electronic card according to the invention.

On FIG. 1, card 1 basically comprises three layers, namely a first layer 2 formed from a solid material, in particular a synthetic plastic material, a second layer 4 formed from a solidified binder 6 in which various elements are immersed, namely an electronic unit 8 housed in the interior of a protection ring 10 and electrically coupled to a coil 12 serving as a magnetic coupling with an external communication unit, not shown. Furthermore, in layer 4, there is provided a positioning structure 14 serving to position coil 12 and the electronic unit 8 in the interior of the card. In particular, the positioning structure 14 serves to define an internal zone within binder layer 4 for coil 12 and the electronic unit 8. The usefulness of such positioning structure has already been described in patent document EP 0 570 784 and will once again be specified in the description of the embodiment of the method according to the present invention.

Card 1 further comprises a third layer 16 formed from solid material, for example a plastic material. Binder 6 is chosen so that, once solidified, it exhibits good adhesion to the material used for layers 2 and 16. According to an essential characteristic of the invention, a relief 18 is provided on the inner face 20 of the first layer 2. According to a special characteristic of the invention, the inner face 22 of layer 16 has a relief 24 substantially identical to the relief 18. It will be further noted that layers 2 and 16 respectively comprise two planar outer faces 26 and 28 onto which a printed message can be provided.

The positioning structure 14 shows, for example, a configuration similar to any one of the configurations provided in patent document EP 0 570 784. Coil 12 has a cross-section of rectangular form and exhibits a first surface 30 and a second surface 32 which are substantially planar and located respectively facing the inner faces 20 and 22 of layers 2 and 16. Here it will be mentioned that the entire inner faces 20 and 22 are respectively covered over by the reliefs 18 and 24. Thus, in particular, the superposition zone of face 20 of the layer 2 with the surface 30 of coil 12 shows a relief. The structure of the relief is provided in a manner such that this relief exhibits sunken valleys entirely traversing said superposition zone. Two special variants for the relief provided on faces 20 and 22 will be described with the help of FIGS. 4 and 6.

Figure 2:
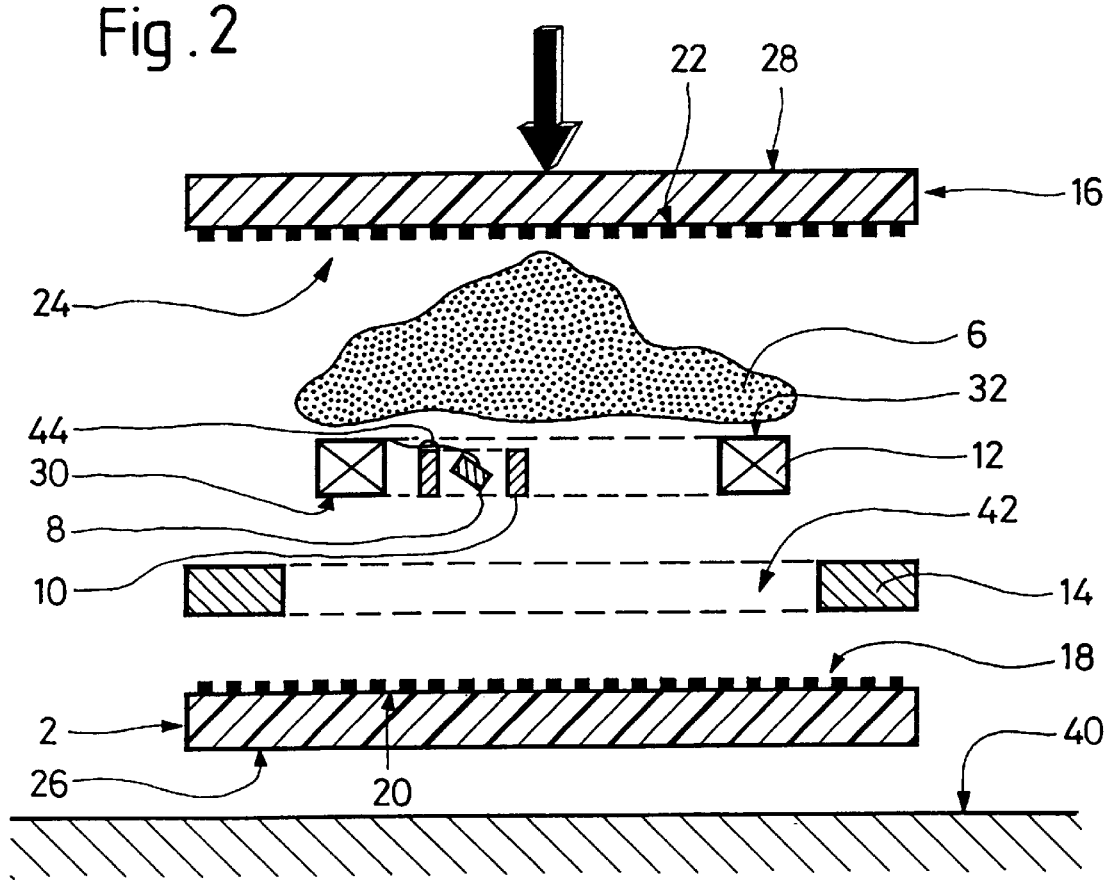
FIG. 2 shows schematically one embodiment of a method of manufacture of the card shown on FIG. 1.

On FIG. 2 is schematically shown a particularly advantageous and undemanding method of manufacture for card 1. The method of manufacture according to the invention comprises the following consecutive steps:

I) the bringing onto a work surface 40 of the first layer 2 exhibiting on its inner face 20 the relief 18 hereinbefore described. The outer face 26 is placed on the planar work surface 40, the inner face 20 being located on the side opposite such work surface 40;

II) the bringing onto the internal face 20 of the positioning structure 14 which exhibits a principal opening 42 into which are next brought the coil 12 and the electronic unit 8 located on the interior of the protection ring 10;

III) the bringing in of a binder 6 in the form of a viscous liquid in a quantity sufficient to form layer 4 of card 1;

IV) the bringing in of the second outer layer 16 onto the binder 6 in a manner such that the inner face 22 exhibiting relief 24 is located on the side of binder 6;

V) the application of pressure on the outer face 28 of layer 16 and consequently on binder 6 in the viscous liquid state so that such binder 6 spreads out uniformly between the two outer layers 2 and 16 in order to form an intermediate layer of predetermined height;

VI) the hardening of binder 6 to form the second layer 4 of card 1.

During step VI pressure directed perpendicularly to the work surface 40 will be advantageously maintained. It will be noted that, without departing from the framework of the present invention, the molecular structure and/or the composition of binder 6 can vary between the liquid state in which it is brought in and the final solid state.

Thanks to the relief 18 provided on the inner face 20 of the first outer layer 2, the various elements brought in, in particular coil 12 and the positioning frame 14 cannot be applied against the inner face 20 so as to prevent the infiltration of binder 6 or to retain residual air between the outer projections defining external cavities, in particular on surface 30 of coil 12 during step V in which pressure is exerted so as to distribute binder 6 uniformly between the two outer layers 2 and 16. Effectively, relief 18, exhibiting sunken valleys traversing the internal face 20, the binder can readily penetrate between the lower surfaces of the incorporated elements and the internal face 20 which thus assures good adhesion of the various layers of the card and evacuation of all residual air, damaging for the flatness of the card.

It will be mentioned that binder 6 being applied subsequently to the bringing in of the various elements incorporated in layer 4, such binder 6 spreads out more easily on the upper surfaces of the various elements incorporated in layer 4, in particular the surface 32 of coil 12. This is all the more so that the quantity of binder 6 applied is greater than the quantity of binder finally forming layer 4. However, in the case in which the height of one of the incorporated elements, in particular coil 12, is substantially equal to the predetermined height of the intermediate layer 4 and given the presence of relief 18 on face 20 of layer 2, it can happen that such elements rise up slightly during application of a pressure and come to bear against the inner face 22 of the second outer layer 16. To avoid this, it has been provided that the inner face 22 of layer 16 also exhibits a relief 24 similar to relief 18.

It will be noted that the method here described can be practised in an environment having a certain degree of vacuum. Furthermore, the pressure exerted on the binder can be provided by various means, in particular a flat press, one or several rolling cylinders.

With the help of FIGS. 3 and 4, there will be briefly described hereinafter a variant of the embodiment of a card according to the invention.

Card 51 comprises a layer 2, identical to that of card 1, comprising in particular an inner face 20 exhibiting a relief 18. Card 51 further comprises a layer 54 formed from a solidified binder 6 in which is incorporated a coil 12 electrically coupled to an electronic unit 58. Coil 12 and the electronic unit 58 are entirely immersed in the binder 6 of layer 54.

Figure 3:
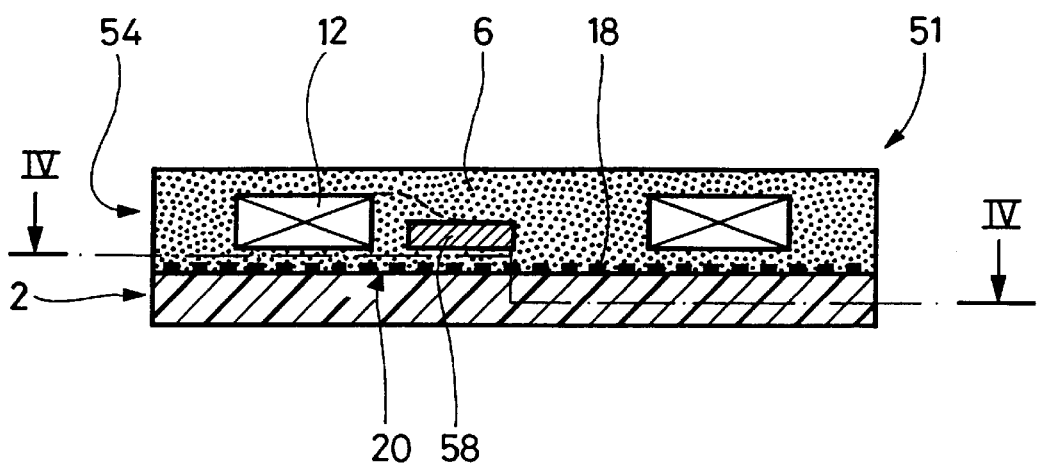
FIG. 3 is a cross-section view of a first variant of the first embodiment.
Figure 4:
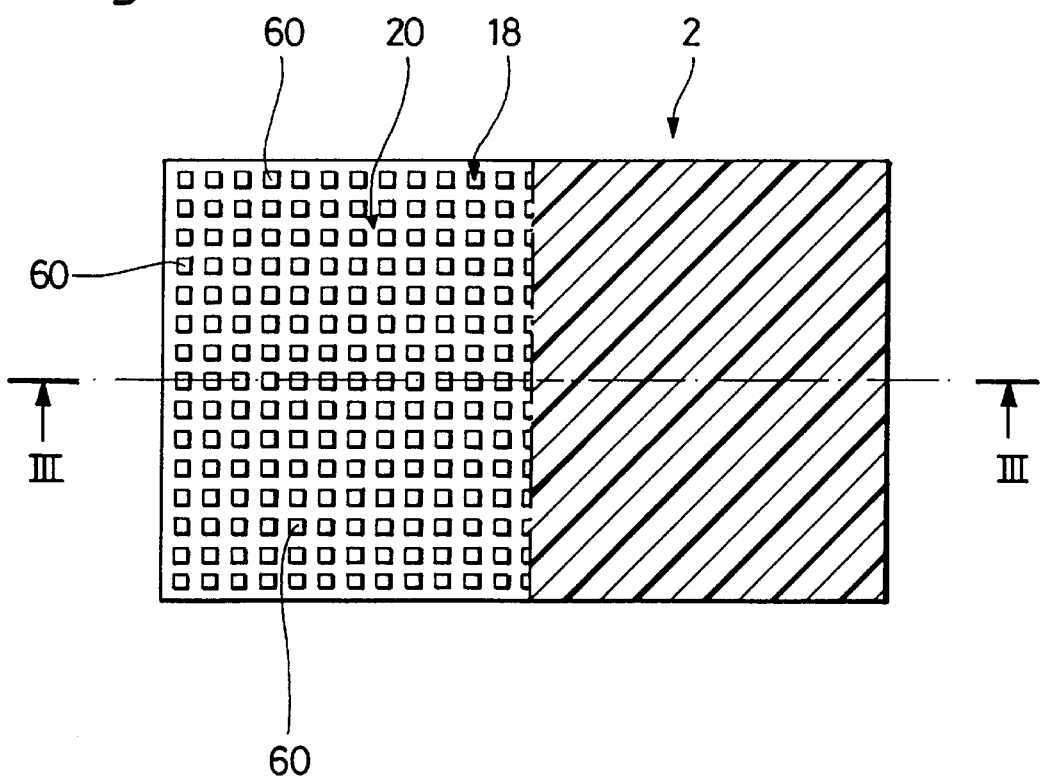
FIG. 4 is a view along the section line IV—IV of FIG. 3.

On FIG. 4 is shown a plan view according to section line IV—IV of FIG. 3, binder 6 not being shown in order to permit a partial view of the inner face 20 exhibiting relief 18. Such relief is formed by a set of small blocks 60 of little height. Thus, the relief 18 defines sunken valleys between the set of such blocks 60, such valleys traversing entirely the inner face 20 of the outer layer 2 and defining multiple paths for infiltration of binder 6 and evacuation of the residual air during the process of manufacture of the card described hereinbefore. By way of example, relief 18 is a relief impressed by conventional impression techniques or formed by embossing layer 2.

With the help of FIGS. 5 and 6, there will be briefly described hereinafter a second variant embodiment of a card according to the invention.

Card 6 comprises a first outer layer 62, a second outer layer 64 and an intermediate layer 66 formed by a solidified binder 6. In the interior of layer 66 is incorporated a coil 12 and an electronic unit 8 arranged on the face 68 of a substrate 70. On such face 68 is also partially arranged the coil 12. Substrate 70 serves in particular to define the position of unit 8 relative to the coil 12 and also serves as an electric inter-connection support between such unit 8 and coil 12.

Substrate 70 is located on the side of layer 62, the planar face 72 of such substrate being located facing the inner face 74 of layer 62 which exhibits a relief 76 defining a set of pyramids 78 of comparatively little height relative to the height of the layer 66. It will be mentioned that during the process of manufacture of card 61, layer 62 is initially brought onto the work surface. Next, binder 6 is applied once the assembly formed by coil 12, unit 8 and support 70 has been placed on layer 62.

Figure 5:
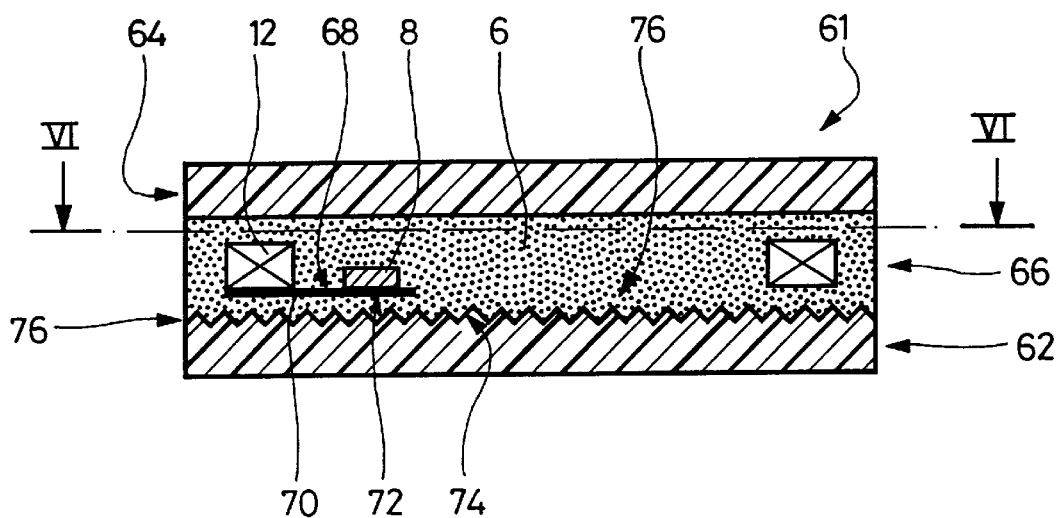
FIG. 5 is a cross-section view of a second variant of the first embodiment.
Figure 6:
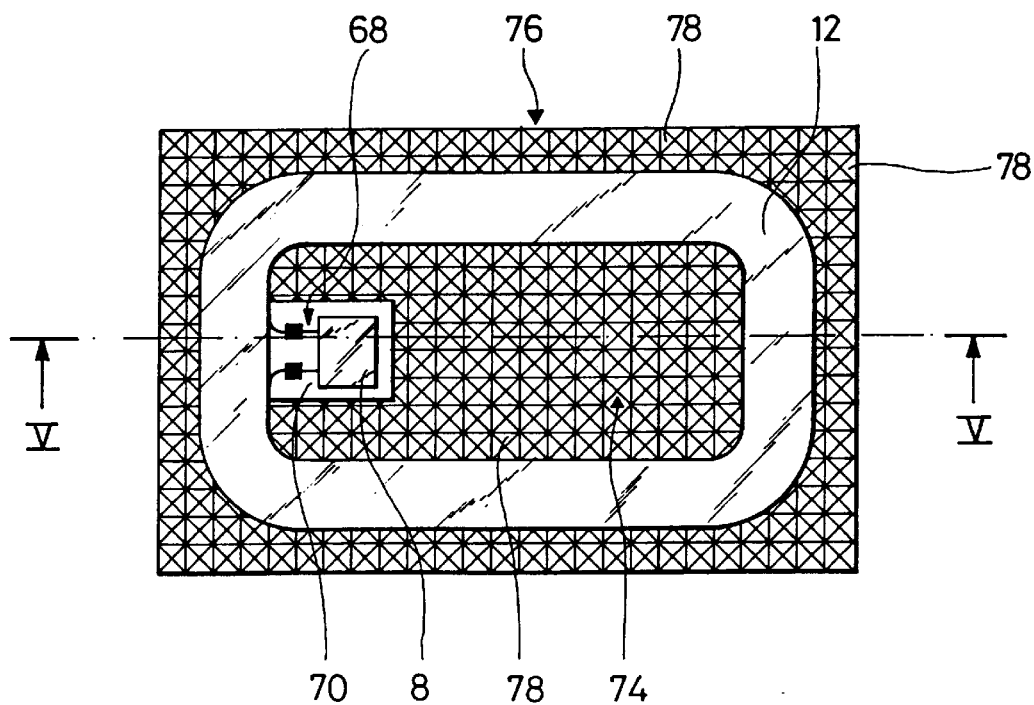
FIG. 6 is a view along the section line VI—VI of FIG. 5.

Again, in the plan view of FIG. 6 according to the section line VI—VI of FIG. 5, binder 6 has not been shown so as to show up the relief 76 and the assembly formed by coil 12, unit 8 and substrate 70. By way of example, relief 76 is obtained by knurling or by die stamping layer 62.

Relief 76 defines sunken valleys traversing the inner face 74 of layer 62. Furthermore, such a relief minimizes the contact surface between the incorporated elements and the inner face 74 if such incorporated elements are arranged to bear against relief 76.

As has already been mentioned, the importance of the presence of a relief is essential on the outer lower layer initially brought in during the process of manufacture of a card according to the invention. The presence of such a relief on the inner face of the upper layer is advantageous and enables guaranteeing a perfectly planar card. Nevertheless, the numerous experiments carried out have shown that the relief provided on the inner face of the upper layer was not indispensable in a certain number of cards manufactured according to the process of the invention. What is more, in certain embodiments, it can happen that the incorporated elements exhibit only a single substantially planar face located facing the lower layer.

In other terms, the relief provided on the inner face of the lower layer plays an essential role when the incorporated elements exhibit at least one substantially planar lower surface or exhibit external cavities located between the external projections against which a geometric plane can be bearing so as to close substantially such cavities. Next, when the incorporated elements exhibit at least one substantially planar upper surface, it is generally advantageous also to provide a relief on the inner face of the upper outer layer. This latter relief is that much more advantageous when the element or elements exhibiting a planar upper surface have a height less than, but substantially equal to the height of the layer formed by the solidified binder in which they are incorporated.

For reasons of security and industrial yield, it is nevertheless preferable to provide a relief on each of the two respective inner faces of the two outer layers.

Finally, it will be mentioned that binder 6 applied in the form of a viscous liquid is preferably chosen in a manner such that it can be applied at a relatively low temperature, in particular at ambient temperature. By way of example, the binder is constituted by a resin known to persons skilled in the art. Among such resins can be mentioned epoxy resin and two-components glues.

What is claimed is:

1. A card comprising:

at least one electronic element, a first layer formed from a solid material and having a first inner face, and a second layer formed by a solidified binder in which said electronic element is located and which adheres to the first inner face of said first layer, wherein said first inner face exhibits a relief provided at least on the interior of a first zone on which the electronic element is located, said relief defining sunken valleys traversing said first zone.

2. The card of claim 1, further comprising a third layer having a second inner face to which said solidified binder of said second layer adheres, such third layer being arranged in a manner such that said second layer forms an intermediate layer between said first and third layers.

3. The card of claim claim 2, in which said electronic element has a second surface that is substantially planar or exhibits at least one external cavity which can be substantially closed by a geometric plane, wherein said second inner face exhibits a relief provided at least on the interior of a second zone comprising the surface of superposition with said second surface of said electronic element, such relief defining sunken valleys traversing said second zone.

4. The card of claim 1, wherein said electronic element is constituted by a coil exhibiting a substantially rectangular cross section, such coil being electrically coupled to an electronic unit.

5. The card of claim 1, wherein said electronic element is constituted by a rigid protection ring surrounding an electronic unit.

6. The card of claim 1, wherein said electronic element is formed by a substrate on which an electronic unit is fixedly arranged.

7. The card of claim 1, wherein said electronic element is formed by an electronic unit.

8. The card of claim 1, wherein said relief is formed by an indentation made on an initially planar surface of said first layer.

9. The card of claim 1, wherein said relief is obtained by knurling, by stamping, or by embossing said first layer.

10. A card comprising:

at least one electronic element, a first layer formed from a solid material and having a first inner face, and a second layer formed by a solidified binder in which said electronic element is located and which adheres to the first inner face of said first layer, wherein the totality of said first inner face exhibits a relief so that the interior of a first zone on which the electronic element is located is provided with said relief, said relief defining sunken valleys traversing entirely said first zone.

11. The card of claim 10, further comprising a third layer having a second inner face to which said solidified binder of said second layer adheres, such third layer being arranged in a manner such that said second layer forms an intermediate layer between said first and third layers.

12. The card of claim 11, in which said electronic element has a second surface that is substantially planar or exhibits at least one external cavity which can be substantially closed by a geometric plane, wherein said second inner face exhibits a relief provided at least on the interior of a second zone comprising the surface of superposition with said second surface of said electronic element, such relief defining sunken valleys traversing said second zone.

13. The card of claim 10, wherein said electronic element is constituted by a coil exhibiting a substantially rectangular cross section, such coil being electrically coupled to an electronic unit.

14. The card of claim 10, wherein said electronic element is constituted by a rigid protection ring surrounding an electronic unit.

15. The card of claim 10, wherein said electronic element is formed by a substrate on which an electronic unit is fixedly arranged.

16. The card of claim 10, wherein said electronic element is formed by an electronic unit.

17. The card of claim 10, wherein said relief is formed by an indentation made on an initially planar surface of said first layer.

18. The card of claim 10, wherein said relief is obtained by knurling, by stamping, or by embossing said first layer.

19. A card comprising:

a first layer formed from a solid material and having a first inner face exhibiting a relief on an interior of a first zone, said relief defining sunken valleys traversing said first zone;

a second layer formed by a solidifiable binder material which adheres to said first inner face; and, an electronic element disposed within said second layer so as to overlay said sunken valleys, said electronic element having a first surface facing said first layer, said first surface having a configuration that does not match the relief exhibited by said first inner face so that spaces exist between said first surface and said first inner face, said sunken valleys providing paths through which said solidifiable binder material fills said spaces.

* * * * *